United States Patent
Domes et al.

(10) Patent No.: US 8,729,566 B2
(45) Date of Patent: May 20, 2014

(54) SEMICONDUCTOR SWITCHING ARRANGEMENT HAVING A NORMALLY ON AND A NORMALLY OFF TRANSISTOR

(75) Inventors: Daniel Domes, Ruethen (DE); Uwe Jansen, Werl (DE)

(73) Assignee: Infineon Technologies AG, Neubiberg (DE)

( * ) Notice: Subject to any disclaimer, the term of this patent is extended or adjusted under 35 U.S.C. 154(b) by 562 days.

(21) Appl. No.: 13/086,639

(22) Filed: Apr. 14, 2011

(65) Prior Publication Data

US 2011/0254018 A1    Oct. 20, 2011

(30) Foreign Application Priority Data

Apr. 15, 2010    (DE) .......................... 10 2010 027 832

(51) Int. Cl.
  *H01L 29/12*    (2006.01)
(52) U.S. Cl.
  USPC ......... 257/77; 257/76; 257/183; 257/E29.068
(58) Field of Classification Search
  USPC ................ 257/77, 76, 183, E29.068
  See application file for complete search history.

(56) References Cited

U.S. PATENT DOCUMENTS

| 4,663,547 | A | 5/1987 | Baliga et al. | |
| 7,777,553 | B2 | 8/2010 | Friedrichs | |
| 2005/0068068 | A1 | 3/2005 | Hall | |
| 2008/0002324 | A1* | 1/2008 | Logiudice et al. | 361/91.2 |
| 2010/0265080 | A1* | 10/2010 | Henson | 340/657 |

FOREIGN PATENT DOCUMENTS

| CN | 1860669 A | 11/2009 |
| DE | 102006029928 B3 | 9/2007 |
| DE | 102009016627 A1 | 10/2009 |
| EP | 0063749 A | 11/1982 |

OTHER PUBLICATIONS

Office Action issued Nov. 10, 2010 in re Application No. DE102010027832.7.

* cited by examiner

*Primary Examiner* — Marc Armand
(74) *Attorney, Agent, or Firm* — Murphy, Bilak & Homiller, PLLC

(57) ABSTRACT

A semiconductor switching arrangement includes a normally on semiconductor component of a first conduction type and a normally off semiconductor component of a second conduction type which is the complement of the first conduction type. A load path of the normally off semiconductor component is connected in series with the load path of the normally on semiconductor component. A first actuation circuit connected between the control connection of the normally on semiconductor component and a load path connection of the normally on semiconductor component. The load path connection of the normally on semiconductor component is arranged between the normally on and normally off semiconductor components. A second actuation circuit is connected between the control connection of the normally off semiconductor component and a load path connection of the normally off semiconductor component. The load path connection of the normally off semiconductor component is arranged between the normally on and normally off semiconductor components.

20 Claims, 2 Drawing Sheets

SEMICONDUCTOR SWITCHING ARRANGEMENT HAVING A NORMALLY ON AND A NORMALLY OFF TRANSISTOR

PRIORITY CLAIM

This application claims priority to German Patent Application No. 10 2010 027 832.7 filed on 15 Apr. 2010, the content of said application incorporated herein by reference in its entirety.

TECHNICAL FIELD

The present application relates to a semiconductor switching arrangement having a normally on and a normally off transistor which each having a load path and an actuation connection and the load paths of which are connected in series.

BACKGROUND

Semiconductor switching arrangements having a normally on and a normally off transistor are known from EP 0 063 749 B1, for example. This known switching arrangement has an n-JFET (junction field effect transistor), as a normally on component, connected in series with an n-MOSFET (metal oxide semiconductor field effect transistor), as a normally off component. The control connection of the JFET is connected to the load connection of the MOSFET, the load connection being remote from the JFET. Such a cascode circuit having a JFET and a MOSFET can be used to switch electrical loads. In this context, an actuation signal needs to be provided only for the MOSFET, since the switching state of the JFET always follows the switching state of the MOSFET on the basis of the interconnection explained above.

The dielectric strength of such a semiconductor switching arrangement is determined essentially by the dielectric strength of the JFET. The dielectric strength of the MOSFET merely needs to be high enough for the MOSFET to be able to block the actuation voltage which is required for turning off the JFET.

DE 10 2006 029 928 B1 describes a cascode circuit for an n-JFET and for an n-MOSFET in which a separate actuation circuit is provided for the JFET. The MOSFET connected in series with the JFET is used merely as a protective element which, in the event of a fault in the actuation circuit of the JFET, is intended to ensure that the JFET is safely switched off. If there is no fault in the actuation circuit, the MOSFET is permanently on. In this circuit arrangement, the gate circuit, that is to say the circuit in which a charging current flows in order to turn on the JFET and a discharge current flows in order to turn off the JFET, comprises the MOSFET. Parasitic inductances on the connecting line between the two transistors, and parasitic internal inductances in the MOSFET, can have an adverse effect on the switching operations for turning the JFET on and off and can have a particularly adverse effect on switching speed.

SUMMARY

According to an embodiment of a semiconductor switching arrangement, the switching arrangement includes a normally on semiconductor component of a first conduction type having a load path and an actuation connection, a normally off semiconductor component of a second conduction type which is the complement of the first conduction type. The normally off semiconductor component has a load path and an actuation connection, the load path of the normally off semiconductor component being connected in series with the load path of the normally on semiconductor component. A first actuation circuit is connected between the control connection of the normally on semiconductor component and a load path connection of the normally on semiconductor component. The load path connection of the normally on semiconductor component is arranged between the normally on and normally off semiconductor components. A second actuation circuit is connected between the control connection of the normally off semiconductor component and a load path connection of the normally off semiconductor component. The load path connection of the normally off semiconductor component is arranged between the normally on and normally off semiconductor components.

In this semiconductor switching arrangement, the actuation circuit for the normally off semiconductor component does not run through the normally off semiconductor component. As such, parasitic inductances and/or capacitances in the normally off semiconductor component do not have an adverse effect on the actuation of the normally on component.

In accordance with one exemplary embodiment, the first semiconductor component is a JFET and the second semiconductor component is a MOSFET or an IGBT (insulated gate bipolar transistor).

The first semiconductor component may be an n-conductive component and the second semiconductor component may be a p-conductive component, or vice versa.

In accordance with a further embodiment, provision is made for the normally on semiconductor component of the semiconductor switching arrangement to include a first semiconductor material and for the normally off semiconductor component to include a second semiconductor material. The first semiconductor material is silicon carbide (SiC) or gallium nitride (GaN), for example, and the second semiconductor material is silicon, for example. Such a semiconductor switching arrangement combines the properties of semiconductor materials such as SiC or GaN, which are advantageous in terms of switching speed and dielectric strength, but which allow the implementation of a normally off component with difficulty, with the good processing properties of silicon, which allow the implementation of reliable normally off components.

According to an embodiment of a method of operating a semiconductor switching arrangement, the method includes providing a normally on semiconductor component of a first conduction type having a load path and an actuation connection and providing a normally off semiconductor component of a second conduction type which is the complement of the first conduction type, the normally off semiconductor component having a load path and an actuation connection, the load path being connected in series with the load path of the normally on semiconductor component. The method further includes connecting a first actuation circuit between the control connection of the normally on semiconductor component and a load path connection of the normally on semiconductor component, the load path connection of the normally on semiconductor component being arranged between the normally on and normally off semiconductor components. The method also includes connecting a second actuation circuit between the control connection of the normally off semiconductor component and a load path connection of the normally off semiconductor component, the load path connection of the normally off semiconductor component being arranged between the normally on and normally off semiconductor components.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
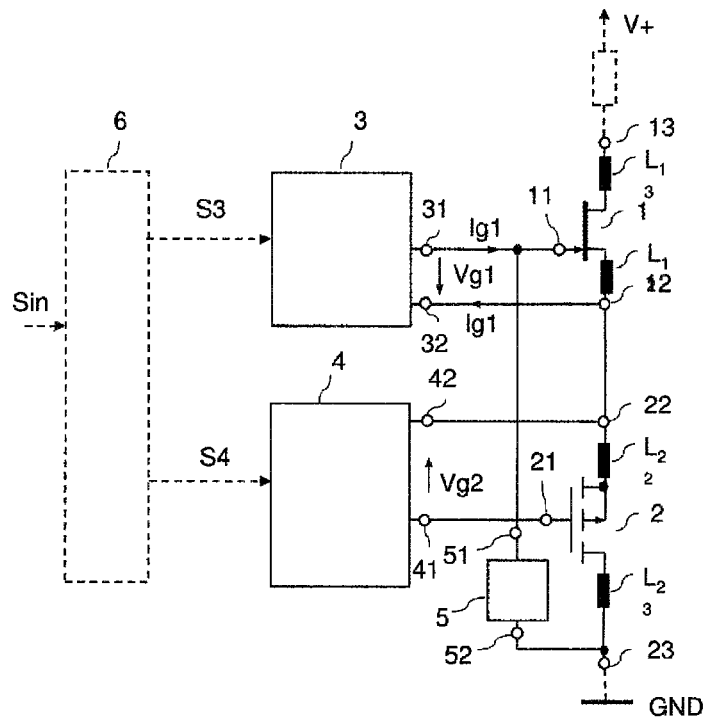
FIG. 1 illustrates an embodiment of a circuit arrangement having a cascode circuit for a normally on and a normally off semiconductor component, each of which have an actuation circuit, and having a decoupling element.

FIG. 1 shows a circuit diagram for an embodiment of a semiconductor switching arrangement. The semiconductor switching arrangement includes a normally on semiconductor component 1 of a first conduction type which has an actuation connection 11 and a load path which runs between a first load path connection 12 and a second load path connection 13. Furthermore, the semiconductor switching arrangement includes a normally off semiconductor component 2 of a second conduction type, which is the complement of the first conduction type. The normally off semiconductor component 2 has an actuation connection 21 and a load path which runs between a first load path connection 22 and a second load path connection 23. The load paths 12-13, 22-23 of the two semiconductor components 1, 2 are connected in series, and the two semiconductor components 1, 2 thereby form a cascode circuit.

The normally on component 1 in the example shown is in the form of a normally on transistor, particularly in the form of an n-JFET, and the normally off component 2 in the example is in the form of a normally off transistor, particularly in the form of a normally off (enhancement) MOSFET. The use of a JFET as a normally on component and of a MOSFET as a normally off component should merely be understood as an example, however. Thus, the normally on component 1 used could also be a normally on (depletion) MOSFET, and the normally off component 2 used could also be a bipolar transistor or an IGBT. Furthermore, it is also possible to interchange the conduction types of the normally on and normally off components 1, 2, that is to say to use a p-conductive component as a normally on component and to use an n-conductive component as a normally off component.

Furthermore, the semiconductor switching arrangement has a first actuation circuit 3 for actuating the normally on component 1 and a second actuation circuit 4 for actuating the normally off component 2. The first actuation circuit 3 is designed to produce an actuation voltage Vg1 and an actuation current Ig1 for the normally on semiconductor component 1. To this end, this actuation circuit 3 is connected between the actuation connection 11 and the first load path connection 12 of the normally on component 1. For the n-JFET shown in FIG. 1, the actuation connection 11 forms a gate connection, the first load path connection 12 forms a source connection and the second load path connection 13 forms a drain connection. In this example, the actuation voltage Vg1 corresponds to the gate-source voltage of the JFET, and the actuation current Ig1 corresponds to the gate current of the JFET.

The second actuation circuit 4 is designed to produce an actuation voltage Vg2 for the normally off semiconductor component 2. To this end, this actuation circuit 4 is connected between the actuation connection 21 and the first load path connection 22. For the p-MOSFET shown in FIG. 1, the actuation connection 21 forms the gate connection, the first load path connection 22 forms the source connection and the second load path connection 23 forms the drain connection. The actuation voltage Vg2 produced by the second actuation circuit 4 corresponds to the gate-source voltage of the MOSFET.

In the semiconductor switching arrangement shown in FIG. 1, the first load path connections or source connections 12, 22, to which the actuation circuits 3, 4 are connected, are respectively arranged between the two semiconductor components 1, 2. In the example shown, these load path connections 12, 22 are electrically conductively connected to one another directly. Optionally, however, it is also possible for further components, such as a resistor component or a diode, to be provided between the first load path connections 12, 22.

With reference to FIG. 1, the circuit arrangement furthermore includes a decoupling element 5 having a first connection 51 and a second connection 52 which are connected between the actuation connection 11 of the normally on component 1 and a node for an actuation potential. This actuation potential is chosen such that when the normally off semiconductor component 2 is turned off, the normally on component 1 can be turned off via the decoupling element 5. In the example shown in FIG. 1, the node for this actuation potential corresponds to the second load path connection 23 of the normally off component 2.

The semiconductor switching arrangement having the normally on and normally off components 1, 2 can be used as a switch for an electrical load Z. To this end, the series circuit including the load paths of the semiconductor components 1, 2 is connected in series with the load Z between terminals for a positive supply potential V+ and a negative supply potential or reference ground potential GND, as shown in dashed lines in FIG. 1. In the example shown, the semiconductor switching arrangement is used as a low-side switch, that is to say is connected between the load Z and reference ground potential GND. In this context, it should be pointed out that this semiconductor switching arrangement can naturally also be used as a high-side switch, that is to say can be connected between the positive supply potential V+ and the load.

It is naturally also possible to provide two such semiconductor switching arrangements which are connected up to form a half-bridge or an inverter. In this case, a first one of the semiconductor switching arrangements is connected between a terminal for a positive supply potential and an output of the half-bridge, while a second one of the semiconductor switching arrangements is connected between the output and a terminal for a negative supply potential or reference ground potential.

The normally on semiconductor component 1 and the normally off semiconductor component 2 can be turned on or off independently of one another by the actuation circuits 3, 4. For the example shown in FIG. 1, with an n-JFET as a normally on component 1, the actuation voltage Vg1 for turning on the JFET 1 is zero or a positive voltage, for example, and for turning off the JFET the voltage is a negative voltage between the gate connection 11 and the source connection 12.

For a p-MOSFET as normally off component 2, the actuation voltage Vg2 for turning on the component is a negative voltage between the gate connection 21 and the source connection 22 and for turning off the component is zero or a positive voltage.

In the case of the semiconductor switching arrangement, the normally off component 2, the second actuation circuit 4 and the decoupling element 5 are provided for safety reasons. These circuit components are intended to prompt the normally on component 1 to be turned off if a fault occurs which prevents the normally on component 1 from being turned off by the corresponding actuation circuit 3, or if a power supply for the first actuation circuit 3 is not or not yet sufficient to achieve turnoff for the normally on transistor 1. By way of example, the latter is the case when the semiconductor switching arrangement is starting up, i.e. during a phase in which there is already a voltage across the load path but the supply voltage for the actuation circuit 3 is not or not yet present at a sufficient level. In a normal, that is to say fault-free, operating state of the semiconductor switching arrangement, the normally off component 2 is turned on permanently by the second actuation circuit 4. In a fault-free operating state, the semiconductor switching arrangement is turned on and off or switched on and off for the purpose of switching the load Z exclusively by turning on and off or switching on and off the normally on semiconductor component 1 using the first actuation circuit 3.

By way of example, the normally on semiconductor component 1 comprises silicon carbide (SiC) or gallium nitrite (GaN) as semiconductor material. Components comprising these semiconductor materials are distinguished from silicon components by a higher dielectric strength for a given switch-on resistance and by higher switching speeds. However, normally off components in these technologies can be produced only with certain restrictions in terms of operation and reliability. The normally off semiconductor component 2 comprises silicon, for example. Normally off semiconductor components comprising silicon can be produced with a high level of reliability and low absence of faults. Although silicon components have a higher switch-on resistance in comparison with components comprising SiC or GaN, a normally off component 2 with a very low dielectric strength can be chosen for the circuit shown in FIG. 1, which means that the switch-on resistance of the component 2 is of barely any consequence. The dielectric strength of the normally off component 2 merely needs to be high enough for the component 2 to be capable of accepting the actuation voltage which is required for turning off the normally on component 1.

The normally on component 1 and the normally off component 2 inevitably have parasitic inductances, which are denoted in FIG. 1 by $L_{12}$, $L_{13}$ for the normally on component 1 and by $L_{22}$, $L_{23}$ for the normally off component 2. These parasitic inductances are formed by metallizations and wiring inside the components, for example, and may furthermore also comprise inductances of bonding wires and contact pins in packages in which the components are integrated. In this context, it should be noted that the two components may also be integrated in a common package, but in separate semiconductor bodies, in order to reduce such inductances.

Inductances in the actuation circuits for the semiconductor components, particularly in the actuation circuit 3 for the normally on component 1 which governs the switching operations for the semiconductor switching arrangement, can have an adverse effect on the switching behavior of the component. Thus, these parasitic inductances can prevent fast changes in the actuation current flow Ig1, for example, as are required for quickly switching on and off the component 1, however.

Furthermore, these parasitic inductances together with parasitic capacitances (not shown) can result in oscillations in the actuation circuit, these likewise possibly affecting fast switch-on and switch-off of the normally on component 1.

Furthermore, parasitic inductances in the load circuit—that is to say the circuit through which a load current flows, such as the inductances $L_{12}$, $L_{13}$, $L_{22}$, $L_{23}$ shown in FIG. 1, may result in induced voltages in the load circuit in the case of fast current changes, as may occur precisely when SiC or GaN components are being switched on and off. Depending on the form of connection (e.g. position of the point 12), these induced voltages can also take effect in the electrical mesh of the actuation circuit or gate circuit 3 and hence can react to the control voltage that is directly active on the normally on transistor 1, as a result of which a negative feedback effect may arise which counteracts fast switching operations. This effect is more pronounced the larger the inductances and the current gradients in the load circuit.

In the circuit arrangement shown in FIG. 1, parasitic inductances in the actuation circuit 3 are minimized by virtue of the actuation circuit 3 being connected between the actuation connection 11 and the first load path connection 12, so that although the actuation circuit 3 includes the parasitic inductance L12 on the source connection 12, it does not—as in the case of known circuits of this kind—also include the parasitic inductances of the normally off component 2.

If a fault is detected in the semiconductor switching arrangement during the actuation of the normally on transistor 1, the normally off transistor 2 is turned off by the corresponding actuation circuit 4. At the same time, an attempt is made to turn off the normally on transistor 1 using the first actuation circuit 3, with a fault in the first actuation circuit 3 meaning that the actuation voltage Vg1 provided is possibly not sufficient to safely turn off the normally on transistor 1. When the normally off transistor 2 is turned off, the electrical potential on the source connection 12 of the normally on transistor 1 rises, with the electrical potential on the gate connection 11 of the normally on transistor 1 being kept at the electrical potential on the drain connection of the normally off transistor 2, i.e. at reference ground potential in the example shown, by the decoupling element 5. As a result, the normally on transistor 1 is safely turned off.

For safety reasons, the normally on transistor 1 and the normally off transistor 2 are actuated such that the normally on transistor 1 cannot be turned on until the normally off transistor 2 is already on. Otherwise, the normally off transistor 2, which may have a lower dielectric strength than the normally on transistor, could be damaged or destroyed by the load voltage which is applied between the supply potential terminals V+, GND. Furthermore, the normally off transistor 2 is not turned off until the normally on transistor 1 is already off or until the first actuation circuit 3 is in a switching state in which the normally on transistor 1 is intended to be turned off. If an actuation voltage Vg1 provided for this purpose is not sufficient, the normally off transistor 2 which has already been turned off, in combination with the decoupling element 5, ensures that the entire semiconductor switching arrangement is safely turned off.

The same applies when the circuit starts up, i.e. during a phase after a load voltage is applied across the series circuit comprising the load paths 12-13 and 22-23, if a supply voltage for the first actuation circuit 3 is not yet sufficient to produce an actuation voltage Vg1 which is required for turning off the normally on transistor 1. The normally off transistor 2 is off at this time and, together with the decoupling element 5, ensures that the normally on transistor 1 is safely turned off.

The normally on transistor 1 and the normally off transistor 2 are turned on and off by the first and second actuation circuits 3, 4, respectively on the basis of control signals S3, S4, for example, which are provided by a central control circuit 6 (shown in dashed lines). This control circuit 6 is a microcontroller, for example, which controls and monitors the operation of the semiconductor switching arrangement. It goes without saying that it is possible for the control circuit 6 and the actuation circuits 3, 4 to be provided in a common integrated circuit. The control circuit 6 uses the control signals S3, S4 to ensure the mode of operation explained previously in which the normally off transistor 2 is turned on only after the normally on transistor 1 has been turned off, and the normally off transistor 2 is turned off again only when the normally on transistor 1 is already off or the actuation circuit 3 thereof is in a state in which the normally on transistor is intended to be turned off.

The control circuit 6 may be supplied with a switching signal Sin which determines the switching state of the semiconductor switching arrangement. The control circuit 6 converts this switching signal into the control signals S3, S4, where in the normal operating state, the normally off transistor 2 is permanently on and the normally on transistor 1 is on or off, i.e. has been switched on or off, according to the switching signal Sin. "Outwardly", this semiconductor switching arrangement behaves like a normally off semiconductor component, i.e. such as a normally off MOSFET or an IGBT.

By way of example, the control signals S3, S4 are binary control signals which may each assume an on level and an off level, where the associated transistor is turned on for an on level on the control signal S3, S4 by the corresponding control circuit 3, 4 and is turned off for an off level. As mentioned, in the normal operating state of the semiconductor switching arrangement, the normally off transistor 2 is permanently turned on.

When the circuit is started up, the normally off transistor 2 remains off at first until the normally on transistor 1 has been safely turned off by the corresponding actuation circuit 3. Such a startup state can be detected by the control circuit 6 by evaluating a supply voltage for the first actuation circuit 3, for example. If this supply voltage is not sufficient to safely turn off the normally on transistor 1, the normally off transistor 2 remains off at first.

If, during the operation of the semiconductor switching arrangement, a fault is detected in that the supply voltage for the first actuation circuit 3 is falling, the normally on transistor 1 is turned off by the corresponding actuation circuit 3, and the normally off transistor is then turned off. Ideally, the normally on transistor 1 is turned off even before the supply voltage for the first actuation circuit 3 has fallen so far that the supply voltage is no longer sufficient to produce an actuation voltage Vg1 for turning off. When the normally off transistor 2 has been turned off, it ensures that the normally on transistor 1 remains safely off if the supply voltage falls further. However, the normally off transistor 2 can ensure that the normally on transistor 1 is turned off even if the amplitude of the actuation voltage Vg1 for the normally on transistor 1 is no longer sufficient to safely turn off the normally on transistor 1.

Figures 2A, 2B:
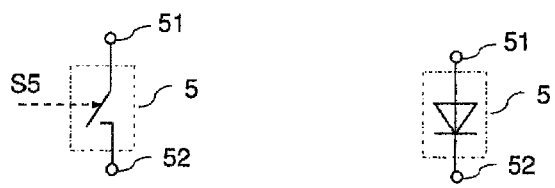
FIG. 2 illustrates embodiments of the decoupling element.

With reference to FIG. 2a, the decoupling element 5 is a switching element, for example, which is actuated by a further control signal S5 delivered by the control circuit 6. By way of example, the switching element is turned on when a faulty operating state (or startup) in the semiconductor switching arrangement is detected. With reference to FIG. 2B, the decoupling element 5 may be in the form of a rectifier element, particularly in the form of a diode, which is connected up such that the electrical potential on the actuation connection of the normally on transistor 1 can rise above the electrical potential on the drain connection of the normally off transistor 2 or reference ground potential only by the value of the forward voltage of the diode.

Figure 3:
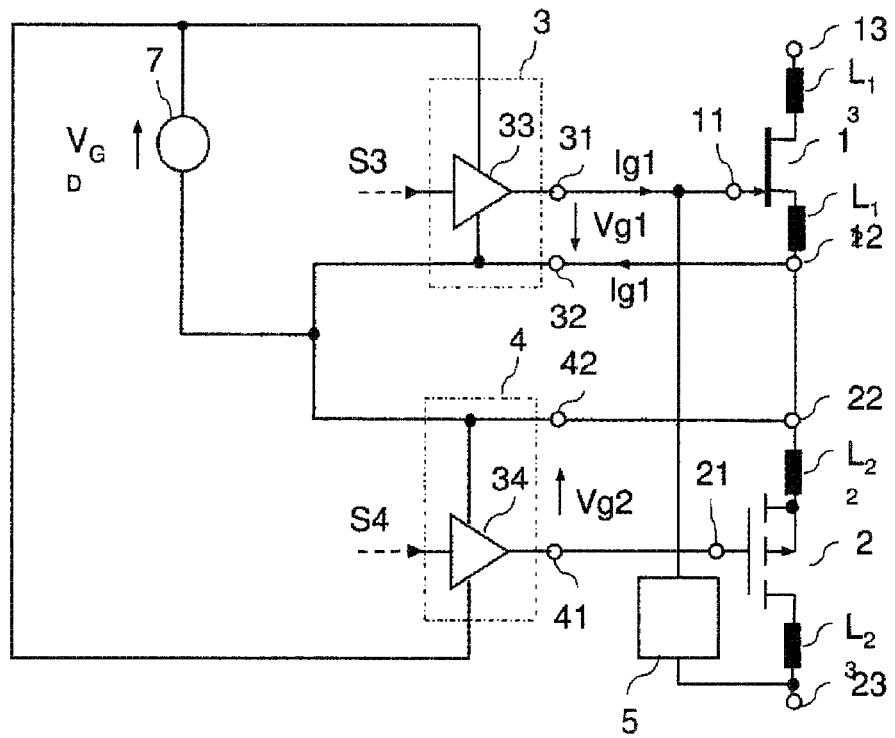
FIG. 3 illustrates an embodiment of a semiconductor switching arrangement in which the actuation circuits have a common supply voltage.

FIG. 3 shows another exemplary embodiment of the semiconductor switching arrangement in which the first and second actuation circuits 3, 4 have a common power supply in the form of a common voltage source 7. This common voltage source 7 provides a supply voltage $V_{GD}$ for the first and second actuation circuits 3, 4. This supply voltage is monitored by the control circuit (not shown in FIG. 3) in order to achieve the protective functions explained previously.

A common power supply 7 of this kind can be provided because the first and second actuation circuits 3, 4 each provide actuation voltages Vg1, Vg2 which are referenced to electrical potentials on the first load path connections 12, 22. In one exemplary embodiment, these load path connections are conductively connected to one another directly, so that the actuation voltages Vg1, Vg2 in this case are actuation voltages which are referenced to a common reference point. The provision of a common power supply for the two actuation circuits 3, 4 helps to reduce the circuit complexity for implementing the semiconductor switching arrangement.

In the example shown, the actuation circuits 3, 4 each include a driver circuit 33, 34, each of which has an actuation input, an actuation output and supply voltage connections. The supply voltage connections of the driver circuits 33, 34 are connected to the common voltage source 7, which provides a supply voltage $V_{GD}$. The inputs of the driver circuits 33, 34 each have one of the control signals S3, S4 supplied to them.

The actuation output of the first driver circuit 33 is connected to a first output 31 of the first actuation circuit 3, and a first supply voltage connection of the first driver circuit 33 is connected to a second output 32 of the first actuation circuit 3. The first actuation circuit 3 is connected between the actuation connection 11 and the first load path connection 12 of the normally on transistor 1 by these outputs 31, 32. These connections 31, 32 have the actuation voltage Vg1 for the normally on transistor 1 applied between them.

Correspondingly, the actuation output of the second driver circuit 34 is connected to a first output 41 of the second actuation circuit 4, and a first supply voltage input of the second driver circuit 34 is connected to a second output 42 of the second actuation circuit 4. The second actuation circuit 4 is connected between the actuation connection 21 and the first load path connection 22 of the normally off transistor 2 by these outputs 41, 42. These connections 41, 42 have the actuation voltage Vg2 for the normally off transistor 2 applied between them.

The driver circuits 33, 34 are designed to take the actuation signals S3, S4 as a basis for producing the actuation voltages Vg1, Vg2 from the supply voltage $V_{GD}$. In the example shown, the voltage source 7 is connected up such that the positive pole thereof is connected to the first load path connections 12, 22 of the transistors 1, 2. The driver circuits 33, 34 are connected up to the voltage source 7 such that the driver circuits 33, 34 are capable of taking the supply voltage $V_{GD}$ and producing respective actuation voltages which may be between zero and a negative voltage value, the absolute value of the negative voltage value possibly corresponding to the absolute value of the supply voltage $V_{GD}$. As mentioned, the n-JFET is on for an actuation voltage Vg1 of zero and is off for a negative actuation voltage Vg1, while the p-MOSFET is off for an actuation voltage Vg2 of zero and is on for a negative actuation voltage Vg2.

Suitable driver circuits 33, 34 are any driver circuits which are capable of taking a supply voltage and producing actuation voltages for transistors according to a control signal, such as the control signals S3, S4.

Figure 4:
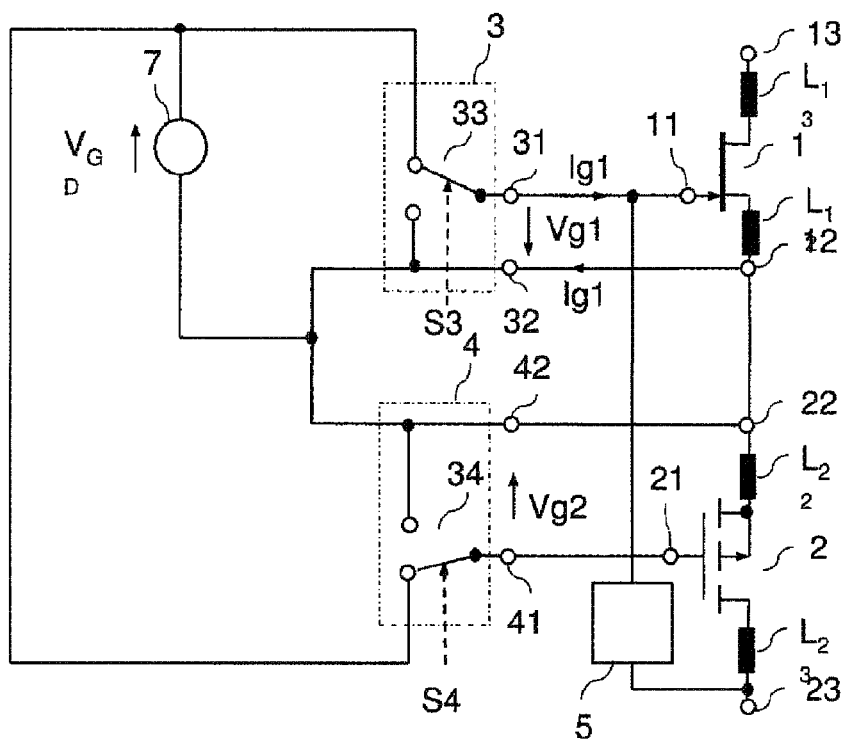
FIG. 4 schematically illustrates an exemplary implementation for the actuation circuits.

FIG. 4 illustrates a manner of operation of such driver circuits 33, 34 in simplified form. In this example, the driver circuits 33, 34 have changeover switches which are actuated by the control signals S3, S4 and which may each assume two different switch positions. The first switch position involves the actuation connections 11, 21 of the transistors 1, 2 being shorted to the first load path connections 12, 22 thereof, so that the actuation voltages Vg1, Vg2 are each zero, the normally on transistor 1 having been turned on and the normally off transistor 2 having been turned off in this case. In the second switch position, the voltage source 7 is connected between the actuation connections 11 and 21 and the first load path connections 12 and 22 such that the actuation voltages Vg1, Vg2 are each negative voltages, the absolute value of which corresponds to the absolute value of the supply voltage $V_{GD}$. In this case, the normally on transistor 1 is off and the normally off transistor 2 is on. If the supply voltage $V_{GD}$ is not sufficient to turn off the normally on transistor 1 upon startup or on account of a fault, this switch position in the first driver circuit 33 allows an actuation voltage Vg1 to be produced by turning off the normally off transistor 2 in combination with the decoupling element 5, the actuation voltage Vg1 turning off the normally on transistor 1. The second switch position for the first driver circuit 33 corresponds to the state of the first driver circuit 33 in which the normally on transistor 1 is intended to be turned off.

In FIG. 4, the switch positions have been chosen such that the changeover switches are each in the second switch position, which means that $Vg1=-V_{GD}$ is true for the actuation voltage Vg1 for the normally on transistor and $Vg2=-V_{GD}$ is true for the actuation voltage Vg2 for the normally off transistor. As a result, the normally off transistor 2 is on and the normally on transistor 1 is off. In this connection, it should be pointed out that the actuation voltage can be derived from the supply voltage $V_{GD}$ in arbitrary fashion in principle. It is thus possible for the maximum amplitude of the actuation voltages Vg1, Vg2 also to be set by suitable circuit measures, such as voltage dividers, such that it is smaller than the amplitude of the supply voltage.

The common voltage source 7 can be a floating voltage source which can be implemented by conventional circuit means, such as charge pumps.

Terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor switching arrangement, comprising:
a normally on semiconductor component of a first conduction type having a load path and an actuation connection;
a normally off semiconductor component of a second conduction type which is the complement of the first conduction type, the normally off semiconductor component having a load path and an actuation connection, the load path of the normally off semiconductor component being connected in series with the load path of the normally on semiconductor component;
a first actuation circuit connected between the control connection of the normally on semiconductor component and a load path connection of the normally on semiconductor component, the load path connection of the normally on semiconductor component being arranged between the normally on and normally off semiconductor components; and
a second actuation circuit connected between the control connection of the normally off semiconductor component and a load path connection of the normally off semiconductor component, the load path connection of the normally off semiconductor component being arranged between the normally on and normally off semiconductor components.

2. The semiconductor switching arrangement as claimed in claim 1, wherein the normally on semiconductor component is a JFET and the normally off semiconductor component is a MOSFET or an IGBT.

3. The semiconductor switching arrangement as claimed in claim 1, wherein the normally on semiconductor component is an n-conductive component and the normally off semiconductor component is a p-conductive component.

4. The semiconductor switching arrangement as claimed in claim 1, wherein the first and second actuation circuits have a common power supply.

5. The semiconductor switching arrangement as claimed in claim 1, further comprising a decoupling element connected between the actuation connection of the normally on semiconductor switching element and a node for an actuation potential.

6. The semiconductor switching arrangement as claimed in claim 1, wherein the normally on semiconductor component comprises a first semiconductor material and the normally off semiconductor component comprises a second semiconductor material.

7. The semiconductor switching arrangement as claimed in claim 5, wherein the node for the actuation potential is the load path connection of the normally off semiconductor component which is remote from the normally on semiconductor component.

8. The semiconductor switching arrangement as claimed in claim 5, wherein the decoupling element is a switching element.

9. The semiconductor switching arrangement as claimed in claim 5, wherein the decoupling element is a rectifier element.

10. The semiconductor switching arrangement as claimed in claim 6, wherein the first semiconductor material is silicon carbide or gallium nitride and the second semiconductor material is silicon.

11. A method of operating a semiconductor switching arrangement, comprising:
- providing a normally on semiconductor component of a first conduction type having a load path and an actuation connection;
- providing a normally off semiconductor component of a second conduction type which is the complement of the first conduction type, the normally off semiconductor component having a load path and an actuation connection, the load path being connected in series with the load path of the normally on semiconductor component;
- connecting a first actuation circuit between the control connection of the normally on semiconductor component and a load path connection of the normally on semiconductor component, the load path connection of the normally on semiconductor component being arranged between the normally on and normally off semiconductor components; and
- connecting a second actuation circuit between the control connection of the normally off semiconductor component and a load path connection of the normally off semiconductor component, the load path connection of the normally off semiconductor component being arranged between the normally on and normally off semiconductor components.

12. The method as claimed in claim 11, wherein the normally on semiconductor component is a JFET and the normally off semiconductor component is a MOSFET or an IGBT.

13. The method as claimed in claim 11, wherein the normally on semiconductor component is an n-conductive component and the normally off semiconductor component is a p-conductive component.

14. The method as claimed in claim 11, wherein the first and second actuation circuits have a common power supply.

15. The method as claimed in claim 11, further comprising connecting a decoupling element between the actuation connection of the normally on semiconductor switching element and a node for an actuation potential.

16. The method as claimed in claim 15, wherein the decoupling element is a switching element.

17. The method as claimed in claim 11, wherein the normally on semiconductor component comprises a first semiconductor material and the normally off semiconductor component comprises a second semiconductor material.

18. The method as claimed in claim 15, wherein the node for the actuation potential is the load path connection of the normally off semiconductor component which is remote from the normally on semiconductor component.

19. The method as claimed in claim 15, wherein the decoupling element is a rectifier element.

20. The method as claimed in claim 17, wherein the first semiconductor material is silicon carbide or gallium nitride and the second semiconductor material is silicon.

* * * * *